United States Patent
Taniguchi et al.

(10) Patent No.: US 10,856,459 B2
(45) Date of Patent: Dec. 1, 2020

(54) COMPONENT SUPPLYING DEVICE

(71) Applicant: YAMAHA HATSUDOKI KABUSHIKI KAISHA, Shizuoka (JP)

(72) Inventors: Yuzuru Taniguchi, Iwata (JP); Yasuyoshi Hongashi, Iwata (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 252 days.

(21) Appl. No.: 15/577,707

(22) PCT Filed: Jun. 2, 2015

(86) PCT No.: PCT/JP2015/065929
§ 371 (c)(1),
(2) Date: Nov. 28, 2017

(87) PCT Pub. No.: WO2016/194148
PCT Pub. Date: Dec. 8, 2016

(65) Prior Publication Data
US 2018/0160575 A1   Jun. 7, 2018

(51) Int. Cl.
| H05K 13/02 | (2006.01) |
| H05K 13/04 | (2006.01) |
| B65H 37/00 | (2006.01) |

(52) U.S. Cl.
CPC .......... H05K 13/02 (2013.01); B65H 37/002 (2013.01); H05K 13/0417 (2013.01); H05K 13/0419 (2018.08)

(58) Field of Classification Search
CPC ...... H05K 13/02; H05K 13/021; H05K 13/04; H05K 13/0408; H05K 13/0409; H05K 13/0417; H05K 13/0419; B65H 37/002
See application file for complete search history.

(56) References Cited

U.S. PATENT DOCUMENTS

| 4,327,482 A | * | 5/1982 | Araki | .......... H05K 13/0419 29/740 |
| 4,610,083 A | * | 9/1986 | Campisi | .......... H05K 13/08 29/832 |
| 4,768,915 A | * | 9/1988 | Fujioka | .......... H05K 13/0419 414/416.08 |
| 4,923,089 A | * | 5/1990 | Hineno | .......... H05K 13/0419 221/1 |

(Continued)

FOREIGN PATENT DOCUMENTS

| CN | 103857275 A | 6/2014 |
| JP | S52-79818 A | 7/1977 |

(Continued)

OTHER PUBLICATIONS

International Search Report issued in PCT/JP2015/065929; dated Sep. 8, 2015.

(Continued)

Primary Examiner — Caril J Arbes
(74) Attorney, Agent, or Firm — Studebaker & Brackett PC

(57) ABSTRACT

A component supplying device supplying a component while using a component supply tape having components thereon includes a reel support portion rotatably supporting a reel around which the component supply tape is wound, a feeder transferring the component supply tape drawn out from the reel toward a component pick-up position and transferring the component supply tape from which the component is picked up at the component pick-up position S1 toward a tape discharge path, and a correction member arranged on a transfer path of the component supply tape between the reel support portion and the tape discharge path. The correction member is configured to correct curl of the component supply tape.

9 Claims, 14 Drawing Sheets

(56) References Cited

U.S. PATENT DOCUMENTS

| | | | | |
|---|---|---|---|---|
| 4,952,113 | A * | 8/1990 | Fujioka | H05K 13/0419 414/416.08 |
| 5,191,693 | A * | 3/1993 | Umetsu | H05K 13/0419 29/429 |
| 5,310,301 | A * | 5/1994 | Aono | H01L 21/67132 414/416.08 |
| 5,342,474 | A * | 8/1994 | Mohara | H05K 13/0417 156/751 |
| 5,419,802 | A * | 5/1995 | Nakatsuka | H05K 13/0417 156/750 |
| 6,162,007 | A * | 12/2000 | Witte | B65H 20/22 414/416.01 |
| 6,379,098 | B1 * | 4/2002 | Shibasaki | H05K 13/0419 414/416.01 |
| 2012/0014084 | A1 * | 1/2012 | Motomura | B23K 3/0638 361/807 |
| 2014/0151490 | A1 | 6/2014 | Kobayashi et al. | |

FOREIGN PATENT DOCUMENTS

| | | |
|---|---|---|
| JP | H02-146898 U | 12/1990 |
| JP | H04-169456 A | 6/1992 |
| JP | H06-069684 A | 3/1994 |
| JP | 2004-007003 A | 1/2004 |
| JP | 2009-117447 A | 5/2009 |
| JP | 2011-079165 A | 4/2011 |
| JP | 2014-130995 A | 7/2014 |
| WO | 2014/016980 A1 | 1/2014 |
| WO | 2014025120 A1 | 2/2014 |

OTHER PUBLICATIONS

An Office Action mailed by the Japanese Patent Office dated Aug. 28, 2018, which corresponds to Japanese Patent Application No. 2017-521401 and is related to U.S. Appl. No. 15/577,707.

An Office Action issued by the Chinese Patent Office dated Jun. 14, 2019, which corresponds to Chinese Patent Application No. 201580080003.3 and is related to U.S. Appl. No. 15/577,707; with English language translation.

An Office Action issued by the State Intellectual Property Office of the People's Republic of China dated Mar. 11, 2020, which corresponds to Chinese Patent Application No. 201580080003.3 and is related to U.S. Appl. No. 15/577,707. with English language translation.

* cited by examiner

COMPONENT SUPPLYING DEVICE

CROSS REFERENCE TO RELATED APPLICATIONS

This application claims benefit of priority to International Patent Application No. PCT/JP2015/065929 filed Jun. 2, 2015, the entire content of which is incorporated herein by reference.

TECHNICAL FIELD

The present technology described in this specification relates to a component supplying device, a surface mounting device including the component supplying device, and a method of supplying components.

BACKGROUND

A tape feeder has been known as an example of a component supplying device that supplies electronic components in a surface mounting device for mounting the electronic components on a printed board. The tape feeder feeds a component supply tape having electronic components thereon. The tape feeder draws the component supply tape from a reel around which the component supply tape is wound and feeds the tape to a pick-up position in the tape feeder. The electronic components are picked up from the component supply tape in the pick-up position and then, the component supply tape is transferred from the tape feeder to a tape chute (a tape discharge path) and is guided to a collection box through the tape chute.

The component supply tape discharged by the tape feeder has curl because the component supply tape is wound around the reel. Therefore, the component supply tape fed by the tape feeder to the tape discharge path enters the tape chute while being curled and may not be moved forward smoothly or may be jammed in the tape discharge path. If a subsequent component supply tape is fed into the tape chute through the tape discharge path in which the previous component supply tape is stuck, the component supply tape may be jammed within the tape chute and machine trouble may be caused.

Japanese Unexamined Patent Publication No. 2009-117447 describes a surface mounting device that prevents such machine trouble caused by the jamming of the component supply tape in the tape chute. Such a surface mounting device includes a rotatable roller near an inlet of the tape chute. According to such a configuration, the curled component supply tape fed by the tape feeder comes in contact with the roller and is forcedly fed forward into the tape chute. Accordingly, the jamming of the component supply tapes is less likely to be caused in the tape chute.

SUMMARY

Technical Problem

However, the surface mounting device in Japanese Unexamined Patent Publication No. 2009-117447 includes the rotatable roller near the inlet of the tape chute and this may increase a size of the device. The surface mounting device may necessarily include a driving mechanism for driving and rotating the roller and a configuration of the device may be complicated.

The technology disclosed herein was made in view of the above circumstances and an object is to provide a component supplying device with which a tape jamming is less likely to be caused in a tape discharge path with a simple structure, a surface mounting device including such a component supplying device, and a method of supplying components with less occurrence of a tape jamming in a tape discharge path.

Solution to Problem

Technology described in this specification relates to a component supplying device supplying components while using a component supply tape having the components thereon, and the component supplying device includes a reel support portion rotatably supporting a reel around which the component supply tape is wound, a feeder transferring the component supply tape drawn out from the reel toward a component pick-up position, the feeder transferring the component supply tape from which the component is picked up at the component pick-up position toward a tape discharge path, and a correction member arranged on a transfer path of the component supply tape and between the reel support portion and the tape discharge path, the correction member being configured to correct curl of the component supply tape.

In the component supplying device, the correction member is arranged on the transfer path of the component supply tape and between the reel support portion and the tape discharge path, and the curl of the component supply tape is corrected before the component supply tape reaches the tape discharge path. The uncurled component supply tape reaches the tape discharge path and therefore, the component supply tape is less likely to be jammed in the tape discharge path due to the curl of the component supply tape. According to the component supplying device, with such a simple structure, the tape jamming in the tape discharge path is less likely to be caused.

In the component supplying device, the component supply tape may include a carrier tape and a top tape, the carrier tape may include component storing portions each having an opening on one side thereof and storing one of the components, and the top tape may close the opening of each of the component storing portions, at a component pick-up position in the feeder, the one of the components may be picked up from the carrier tape having the components arranged in the component storing portions that are exposed by cutting a part of the top tape, the top tape having the part that is cut may be transferred to the component delivery position together with the carrier tape, and the correction member may be arranged on a downstream side of a transfer direction of the component supply tape with respect to the component pick-up position.

According to such a configuration, the component supply tape passing through the correction member includes the carrier tape and the top tape adhering to the carrier tape. Therefore, the curl of the carrier tape and the curl of the top tape are corrected (removed) by the correction member. Compared to a configuration in that the carrier tape from which the top tape is completely separated is transferred to the component pick-up position and only the curl of the carrier tape is corrected by the correction member, the component supply tape that is to be corrected by the correction member has great rigidity and the curl of the component supply tape is easily corrected by the correction member.

In the component supplying device, the correction member may include a tape urging portion that urges a part of the component supply tape.

According to such a configuration, apart of the component supply tape is urged by the urging portion of the correction member and the part of the component supply tape is deformed. Thus, the curl of the component supply tape is corrected.

In the component supplying device, the tape urging portion may be configured to urge the component supply tape with a curved surface that is curved on an opposite side from the curl of the component supply tape.

According to such a configuration, the component supply tape is urged by the curved surface of the tape urging portion so as to be curved on an opposite side from the curl of the component supply tape. Thus, the curl of the component supply tape is corrected. Accordingly, the specific configuration of the correction member for correcting the curl of the component supply tape is provided.

In the component supplying device, the tape urging portion may be configured to urge the component supply tape to be curved or bent with respect to a width dimension of the component supply tape.

According to such a configuration, the component supply tape is curved or bent with respect to a width dimension of the component supply tape by the tape urging portion and the curl of the component supply tape can be corrected. Thus, the specific configuration of the correction member for correcting the curl of the component supply tape is provided.

In the component supplying device, the correction member may be detachably mounted on the feeder.

According to such a configuration, the correction member can be easily mounted on the feeder without having the correction member. The correction member can be easily detached from the feeder if it is not necessary. This improves convenience of the correction member.

In the component supplying device, a width direction of the component supply tape may be a right-left direction of the feeder, and the feeder may be configured to transfer the component supply tape from a rear side toward a front side of the feeder, and the correction member may be disposed in a front portion of the feeder, and the correction member may be configured to correct the curl of the component supply tape such that the component supply tape transferred from the front portion of the feeder to the tape discharge path extends straight vertically due to a weight thereof.

According to such a configuration, after the curl of the component supply tape is corrected by the correction member, the component supply tape is discharged from the front end portion of the feeder toward the tape discharge path such that the component supply tape extends vertically straight downward. Therefore, the tape discharge path is arranged to extend vertically straight along a longitudinal direction of the component supply tape and has a reduced width. As a result, the space for the tape discharge path is reduced.

Another technology described in this specification relates to a surface mounting device including the above component supplying device, a base mount including the tape discharge path, a component mounting device configured to mount the component that is supplied from the component pick-up position on a board that is on a component mount position of the base mount, and a convey device configured to convey the board to the component mount position.

Another technology described in this specification relates to a method of supplying a component including drawing a component supply tape having components thereon and wound around a reel, transferring the component supply tape to a component pick-up position, supplying the components at the component pick-up position, and transferring the component supply tape from which the component is picked up at the component pick-up position toward a tape discharge path, and the method includes a correction process of correcting curl of the component supply tape after the component supply tape is drawn from the reel and before reaching the tape discharge path.

Effects of the Disclosure

According to the present technology described in this specification, a component supplying device with which a tape jamming is less likely to be caused in a tape discharge path with a simple structure, a surface mounting device including the component supplying device, and a method of supplying components with less occurrence of a tape jamming in a tape discharge path are provided.

DETAILED DESCRIPTION

Figure 1:
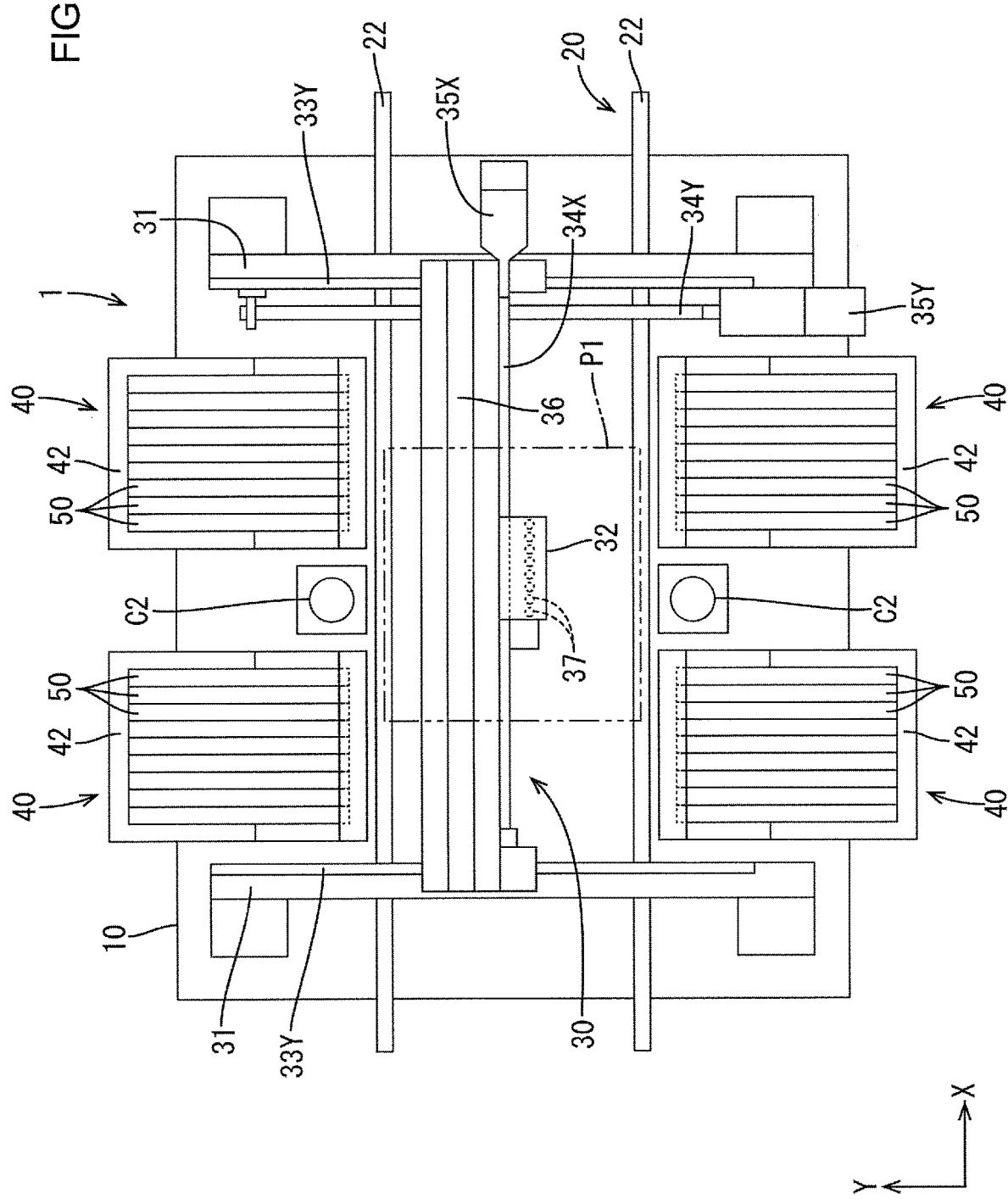
FIG. 1 is a plan view illustrating a surface mounting device.

First Embodiment (Whole Structure of Surface Mounting Device)

A first embodiment will be described with reference to FIGS. 1 to 9. In this embodiment, a surface mounting device 1 and a feeder-type supplying device (an example of a component supplying device) 40 included in the surface mounting device 1 illustrated in FIG. 1 will be described. The surface mounting device 1 of this embodiment includes a base mount 10, a transfer conveyer (an example of a conveyer device) 20 that conveys a printed board (an example of a printed board) P1, a component mounting device 30 that mounts an electronic component (an example of a component) E1 on the printed board P1, and the feeder-type supplying device 40 that supplies the electronic components E1 (see FIG. 4) to the component mounting device 30.

The base mount 10 has a rectangular plan-view shape and a flat upper surface. On the base mount 10, a back-up plate (not illustrated) is disposed below the transfer conveyer 20 to support from a back side the printed board P1 on which the electronic component E1 is mounted. In the following description, a longitudinal direction of the base mount 10 (a left-right direction in FIG. 1) and a transfer direction of the transfer conveyer 20 correspond with an X-axis direction and a short-side direction of the base mount 10 (a vertical direction in FIG. 1) corresponds with a Y-axis direction, and a thickness direction of the base mount 10 (a vertical direction in FIG. 2) corresponds with a Z-axis direction.

The transfer conveyer 20 is arranged in a middle of the base mount 10 with respect to the Y-axis direction and conveys the printed board P1 in the transfer direction (the X-axis direction). The transfer conveyer 20 includes a pair of conveyer belts 22 that is driven to be circulated in the transfer direction. The printed board P1 is put on the conveyer belts 22 ranging from one of the conveyer belts 22 to another one. The printed board P1 is conveyed from one side (a right side in FIG. 1) in the transfer direction to a working position (an area surrounded by a two-dot chain line in FIG. 1) on the base mount 10 along the conveyer belts 22. The printed board P1 is stopped at the working position and the electronic components E1 are mounted thereon and discharged from another side (a left side in FIG. 1) along the conveyer belts 22.

The component mounting device 30 includes a pair of support frames 31, a head unit 32, and a head unit driving mechanism that are disposed above the base mount 10 and the feeder-type supplying device 40, which will be described later. The head unit driving mechanism is configured to drive the head unit 32. The support frames 31 are arranged on both sides of the base mount 10 with respect to the X-axis direction, respectively, and extend in the Y-axis direction. The support frames 31 include an X-axis servo mechanism and a Y-axis servo mechanism that configure the head unit driving mechanism. The head unit 32 is moved by the X-axis servo mechanism and the Y-axis servo mechanism in the X-axis direction and the Y-axis direction within a predefined movable area.

The Y-axis servo mechanism includes Y-axis guide rails 33Y, Y-axis ball screws 34Y where ball nuts are screwed (not illustrated), respectively, and a Y-axis servo motor 35Y. A head support member 36 is mounted on the Y-axis guide rails 33Y and is fixed on the ball nuts. If the Y-axis servo motor 35Y is driven with electric power, the ball nuts can be moved forward and backward along the Y-axis ball screws 34Y and the head support member 36 fixed on the ball nuts and the head unit 32 are moved in the Y-axis direction along the Y-axis guide rails 33Y.

Figure 5:
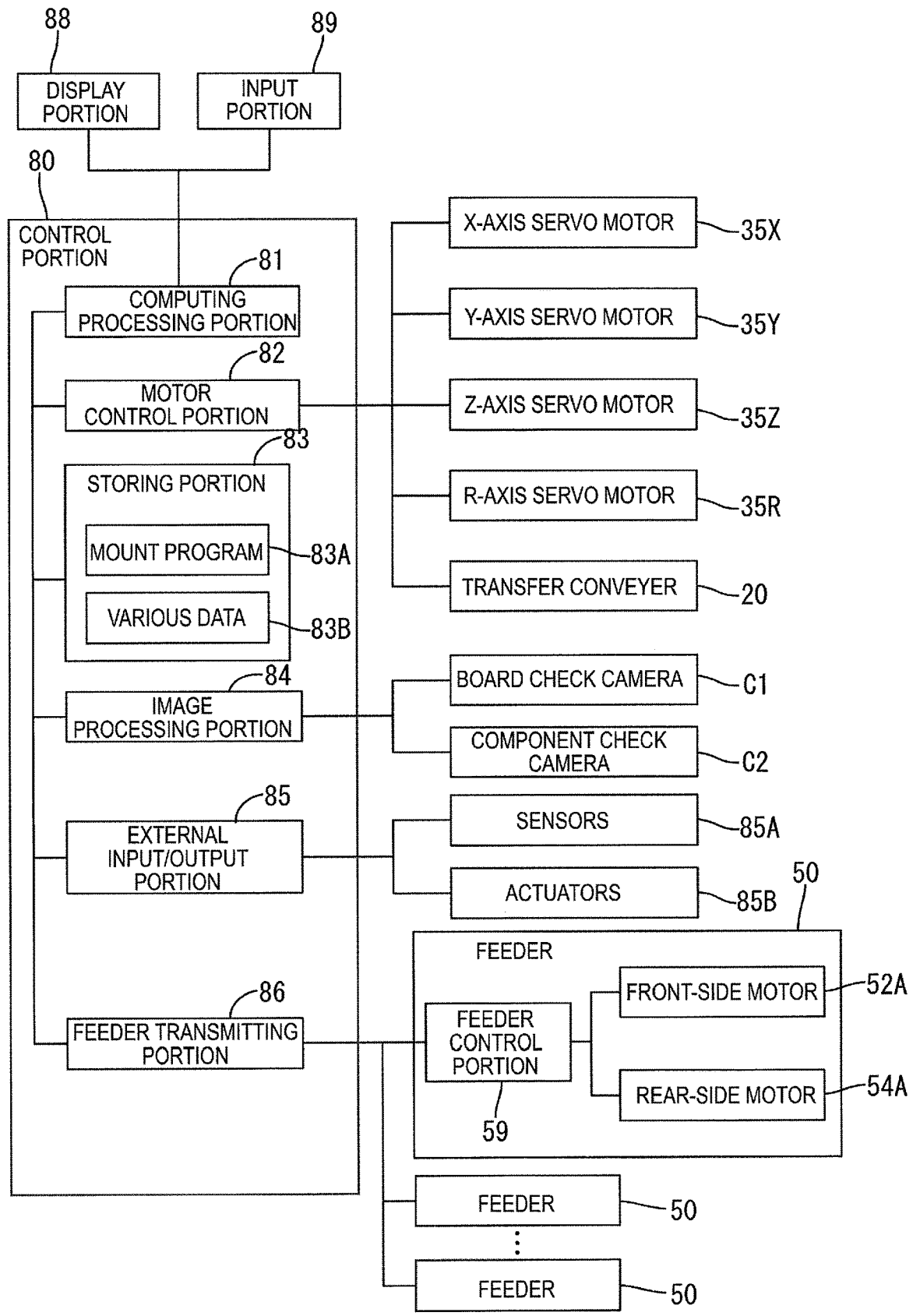
FIG. 5 is a block diagram illustrating an electric configuration of the surface mounting device.

The X-axis servo mechanism includes X-axis guide rails (not illustrated), an X-axis ball screw 34X where a ball nut is screwed (not illustrated), and an X-axis servomotor 35X (see FIG. 5). A head unit 32 is mounted on the X-axis guide rails 33X to be movable along the axis of the X-axis guide rails 33X. If the X-axis servo motor 35X is driven with electric power, the ball nut can be moved forward and backward along the X-axis ball screw 34X and the head unit 32 fixed on the ball nut is moved in the X-axis direction along the X-axis guide rail 33X.

The head unit 32 picks up the electronic component E1 supplied by the feeder-type supplying device 40 and mounts the electronic component E1 on the printed board P1. The head unit 32 includes mount heads 37 arranged in a line and the mount heads 37 perform mounting of the electronic components E1. Each of the mount heads 37 projects downward from the head unit 32 and includes a suction nozzle (not illustrated) at a distal end thereof and the electronic component E1 is suctioned by the suction nozzle with negative pressure. Each of the mount heads 37 is rotatable around a shaft thereof by an R-axis servo motor 35R (see FIG. 5) and is moved vertically (can be lifted and lowered) with respect to the head unit 32 by driving of the Z-axis servo motor 35Z (see FIG. 5).

The head unit 32 includes a board check camera C1 (see FIG. 5). The board check camera C1 is moved integrally with the head unit 32 and takes an image of any part of the printed board P1 that is stopped at the working position. Component check cameras C2 (see FIG. 1) are fixed on the base mount 10 near the working position. Each of the component check cameras C2 takes images of the electronic components E1 that are picked up by the mount head 37.

(Configuration of Feeder-Type Supplying Device)

Figure 2:
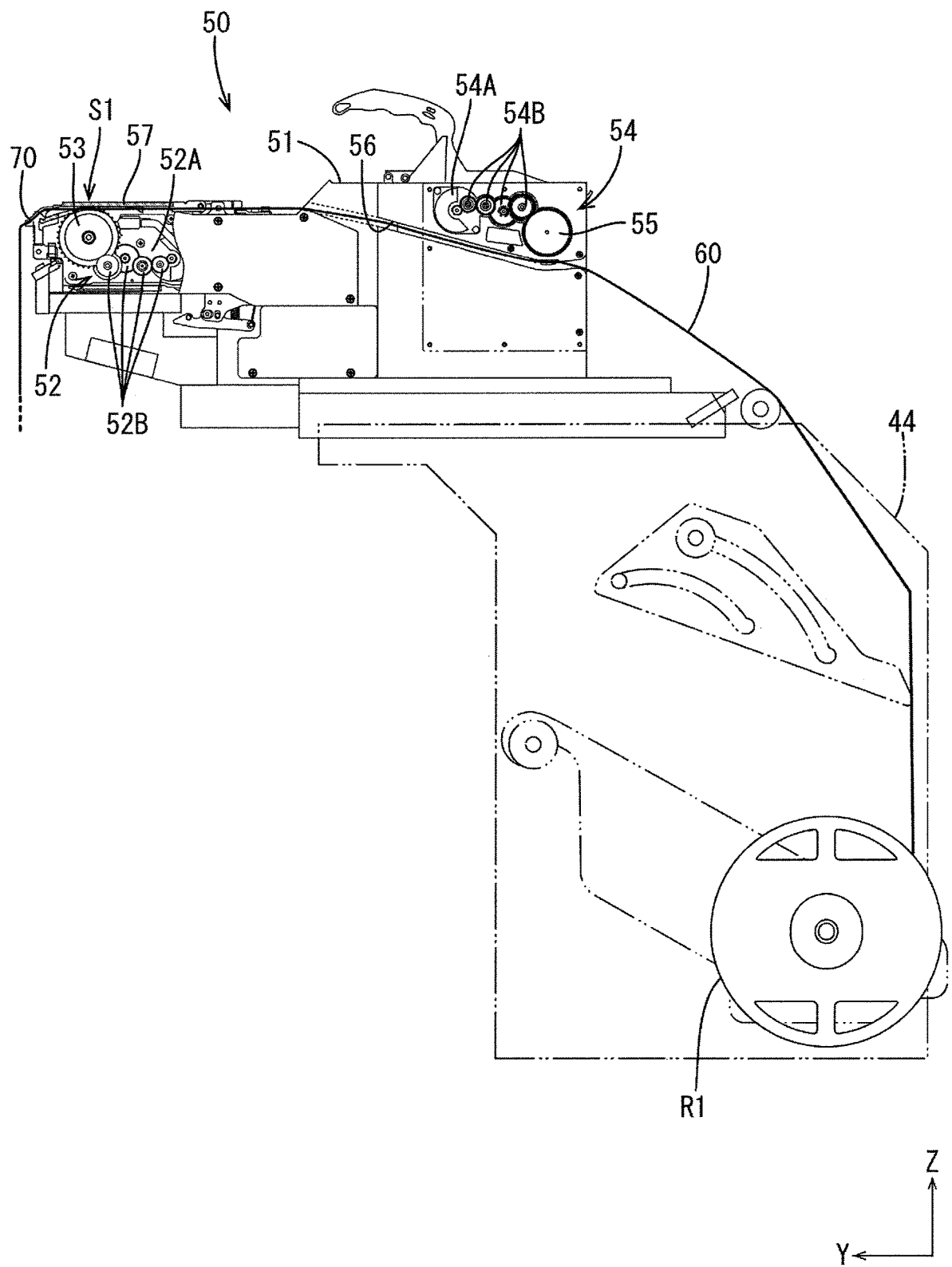
FIG. 2 is a side view schematically illustrating a feeder-type supplying device.

Next, a configuration of the feeder-type supplying device 40 will be described. Two feeder-type supplying devices 40 are arranged in the X-axis direction on each of an upper side and a lower side with respect to the transfer conveyer 20 (in FIG. 1), and namely, a total of four feeder-type supplying devices 40 are arranged. As illustrated in FIGS. 1 and 2, the feeder-type supplying device 40 includes a feeder mount member 42, and a reel support member 44 and draws a component supply tape 60 from the reel support member 44.

In the following description, the feeder-type supplying device 40 has a front portion from which the electronic components E1 are supplied (that faces the transfer conveyer 20, a left side portion in FIGS. 2, 3, 6 to 9) and a rear portion that is an opposite portion from the front portion. A direction perpendicular to a front-rear direction (the Y-axis direction) and an upper-lower direction (the Z-axis direction) in a feeder 50 is a width direction (the X-axis direction, a width direction of a body portion 51, a width direction of a component supply tape) in the feeder 50.

As illustrated in FIG. 1, the feeders 50 are arranged laterally on the feeder mount member 42. Each of the feeders 50 feeds the component supply tape 60 having the electronic components E1 thereon from the rear portion of the feeder 50 toward a component pick-up position S1 (see FIG. 2).

As illustrated in FIG. 2, the reel support member 44 is on a rear side and a lower side with respect to the feeder mount member 42. A reel R1 around which the component supply tape 60 is wound is rotatably supported on the reel support member 44. The component supply tape 60, as is seen in FIGS. 2 and 3, is wound around the reel R1 in a clockwise direction.

As illustrated in FIG. 2, the feeder 50 includes the body portion 51, a front-side driving portion 52, a rear-side driving portion 54, a tape path 56, a tape guide 57, a feeder control portion 59 (see FIG. 5), and a correction member 70. The body portion 51 extends in the front-rear direction (the Y-axis direction). The body portion 51 includes the front-side driving portion 52 in a front portion thereof and includes the rear-side driving portion 54 in a rear portion thereof. The body portion 51 further includes the tape path 56, the tape guide 57, and the feeder control portion 59, and includes the correction member 70 in a front end portion thereof.

Figure 3:
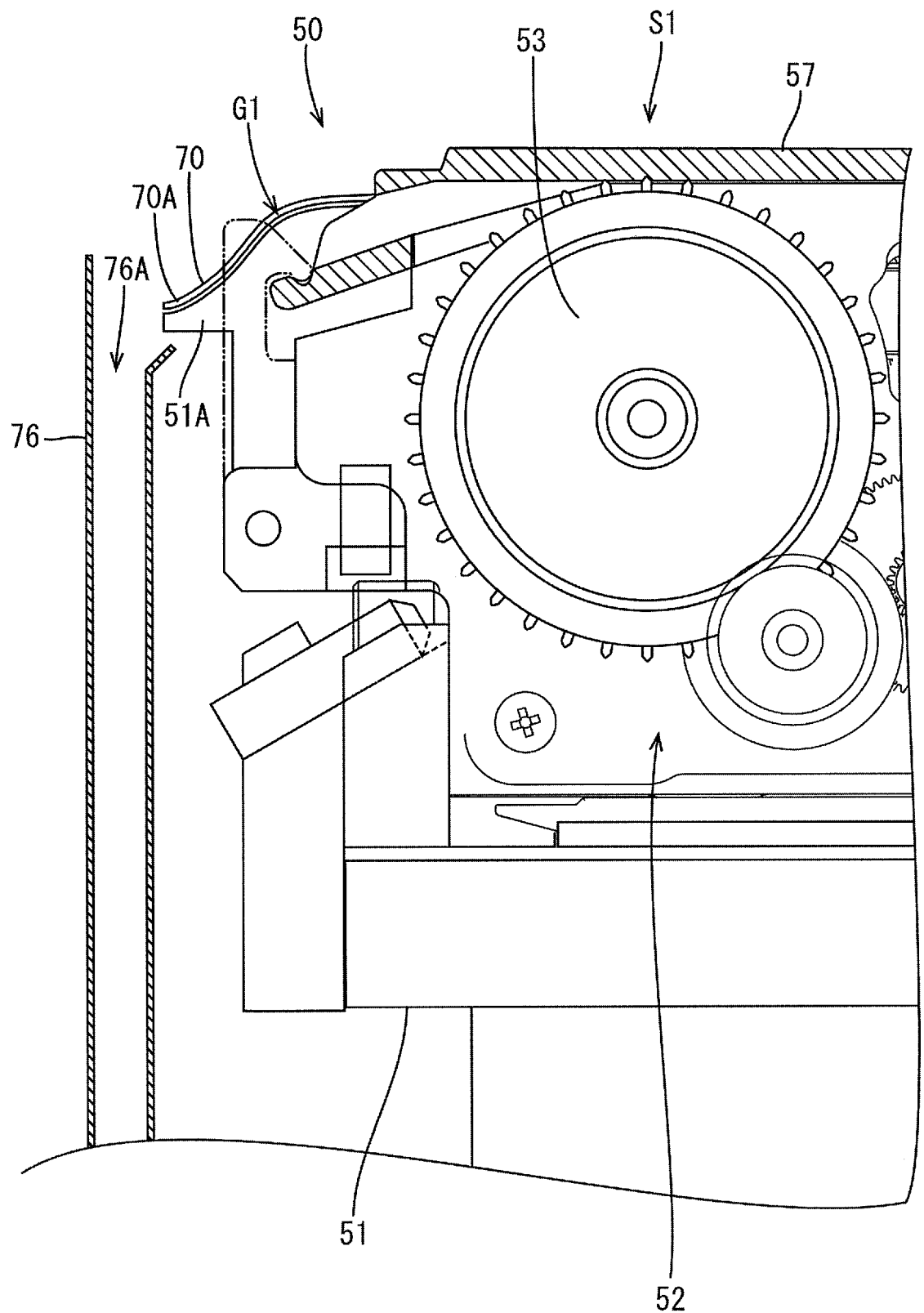
FIG. 3 is an enlarged side view illustrating a portion of a feeder near a front-side driving portion.

As illustrated in FIG. 3, the component supply tape 60 supplied by each feeder 50 is an elongated sheet extending along one direction and is made of synthetic resin, for example. The component supply tape 60 includes a carrier tape 62 and a top tape 64 attached on the carrier tape 62. The carrier tape 62 includes component storing portions 62A at a certain interval. The component storing portions 62A are recessed portions each of which opens upward. The electronic components E1 are arranged in the respective component storing portions 62A and sealed with the top tape 64 and stored therein. The carrier tape 62 has through holes 62B that are arranged at a certain interval along one side edge thereof.

The front-side driving portion 52 of the feeder 50 includes a front-side motor 52A, a front-side gear group 52B including gears, and a front-side sprocket 53 that is disposed in a front end upper portion of the body portion 51. The front-side gear group 52B transfers power from the front-side motor 52A and rotates the front-side sprocket 53. The front-side sprocket 53 has teeth at an equal interval at a periphery thereof and the teeth are to be engaged in the through holes 62B of the component supply tape 60. The front-side driving portion 52 rotates the front-side sprocket 53 whose teeth are engaged in the through holes 62B of the component supply tape 60 so that the component supply tape 60 is moved forward from the front-side driving portion 52.

The rear-side driving portion 54 of the feeder 50 includes a rear-side motor 54A, a rear-side gear group 54B including gears, and a rear-side sprocket 55 that is disposed in a rear end upper portion of the body portion 51. The rear-side gear group 54B transfers power from the rear-side motor 54A and rotates the rear-side sprocket 55. The rear-side sprocket 55 has teeth at an equal interval at an outer periphery thereof and the teeth are to be engaged in the through holes 62B of the component supply tape 60. The rear-side driving portion 54 rotates the rear-side sprocket 55 whose teeth are engaged in the through holes 62B of the component supply tape 60 so that the component supply tape 60 is moved forward from the rear-side driving portion 54.

The component supply tape 60 passes through the tape path 56. The tape path 56 extends through the rear portion of the body portion 51 in the front-rear direction and extends upward obliquely from the rear portion of the body portion 51 toward the front portion of the body portion 51. The component supply tape 60 drawn from the reel R1 enters the tape path 56 from the rear portion of the body portion 51 of each feeder 50 and exits the tape path 56 in the front portion of the body portion 51 and is exposed on the upper surface of the body portion 51.

Figure 4:
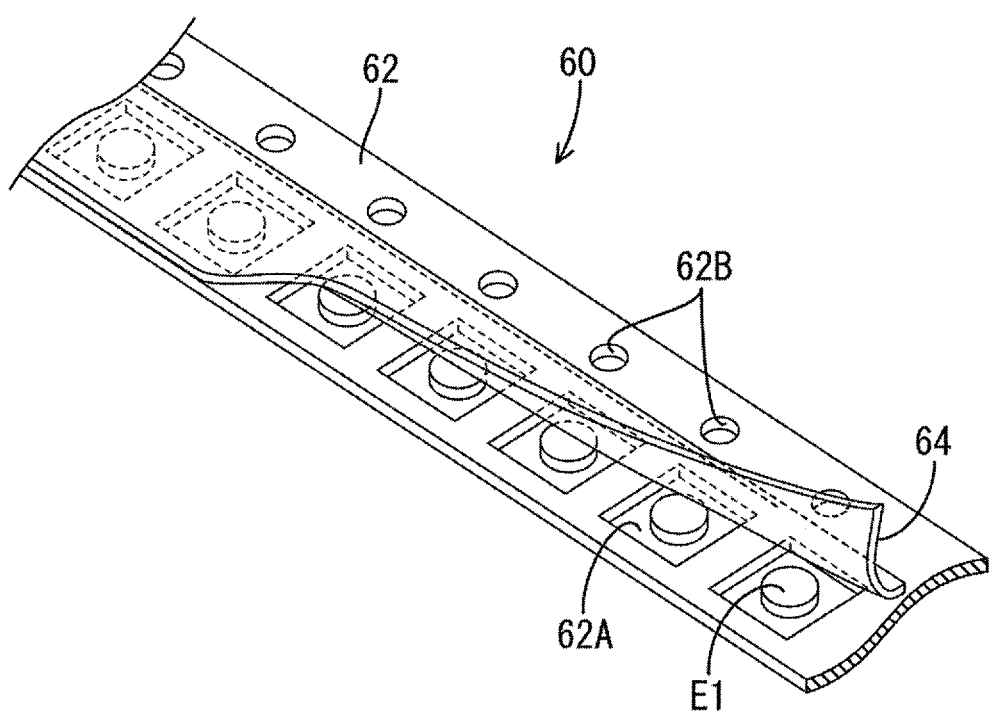
FIG. 4 is a perspective view illustrating a component supply tape having a top tape that is cut.

The tape guide 57 has an elongated shape extending in the front-rear direction and is disposed on an upper surface of the front portion of the body portion 51. The component supply tape 60 passing through the tape path 56 and exposed at the upper surface of the body portion 51 is guided by the tape guide 57 to the font-side sprocket 53 with keeping the component supply tape 60 exposed (uncovered). A cutting mechanism, which is not illustrated, is arranged in a portion of the tape guide 57 that is on a rear side from the component pick-up position S1 and is arranged on an inner wall of the tape guide 57. A part of the top tape 64 is cut by the cutting mechanism. In this embodiment, after a part of the top tape 64 is cut by the cutting mechanism, as illustrated in FIG. 4, the top tape 64 is folded back in one direction with respect to a width dimension of the carrier tape 62. Accordingly, the electronic components E1 stored in the respective component storing portions 62A are exposed outside (uncovered).

Thus, after a part of the top tape 64 of the component supply tape 60 is cut, the component supply tape 60 having the electronic components E1 exposed outside is transferred to the component pick-up position S1. Therefore, the top tape 64, a part of which is cut, is transferred together with the carrier tape 62 to the component pick-up position S1. The mount head 37 is moved to the component pick-up position S1 at a same timing as the electronic component E1 is transferred to the component pick-up position S1, and the electronic component E1 is picked up from the component storing portion 62A of the carrier tape 62. After the electronic component E1 is picked up from the carrier tape 62, the carrier tape 62 is transferred to the front portion of the feeder 50 together with the top tape 64 and discharged to a tape chute 76, which will be described later (an example of a tape discharge path).

The correction member 70 comprises a plate spring made of metal and the plate spring is curved in a substantially S shape. The correction member 70 is configured to correct (reduce) curl of the component supply tape 60. The curl of the component supply tape 60 is caused because the component supply tape 60 is wound around the reel R1. The body portion 51 includes a front end portion 51A having an upper surface following a shape of the correction member 70. As illustrated in FIG. 3, the correction member 70 is arranged above the front end portion 51A of the body portion 51 such that a small clearance G1 is provided between the upper surface of the front end portion 51A (where the component supply tape 60 is discharged) and the correction member 70. The clearance G is provided such that the component supply tape 60 including the cut top tape 64 can pass therethrough. The front end portion 51A of the body portion 51 and the correction member 70 are arranged such that outermost end portions thereof are aligned with each other.

As illustrated in FIG. 3, the tape chute 76 is arranged near the front end portion of the body portion 51 and in front of the feeder 50. The tape chute 76 is arranged for every feeder 50 and is mounted on the base mount 10 of the surface mounting device 1. The tape chute 76 is a duct having substantially a square tubular columnar shape that extends straight vertically and has an upper opening 76A at an upper portion thereof. The opening 76A is near the outermost end portion of the front end portion of the body portion 51. The tape chute 76 has a lower opening (not illustrated) that is open toward a collection box (not illustrated) that is arranged below the tape chute 76.

In the feeder 50 of this embodiment, the component supply tape 60 from which the electronic component E1 is picked up at the component pick-up position S1 is transferred further forward from the feeder 50 by the front-side driving portion 52. A vacant component supply tape 60 passes through the clearance G1 in the front end portion 51A of the body portion 51 and is discharged outside the feeder 50 from the end of the front end portion 51A of the body portion 51. The vacant component supply tape 60 discharged outside the feeder 50 enters the tape chute 76 through the upper opening 76A of the tape chute 76 and is discharged through the lower opening of the tape chute 76 into the collection box.

The correction member 70 is curved in a substantially S shape. With such a configuration, as illustrated in the side view in FIG. 3, the correction member 70 includes a rear side portion (a right portion in FIG. 3) having a curved surface curved to project (be recessed) left upward and a front side portion having a curved surface (an example of a tape urging portion) 70A curved to project (be recessed) right downward. As illustrated in the side views of FIGS. 2 and 3, the component supply tape 60 is wound around the reel R1 in a clockwise direction. Therefore, after the electronic component E1 is picked up at the component pick-up position S1, the vacant component supply tape 60 is curled and projects (recessed) left upward in the side view of FIG. 3 when the vacant component supply tape 60 enters the clearance G1. The front portion of the correction member 70 has the curved surface 70A that is curved (recessed) toward an opposite side from that of the curl of the component supply tape 60.

(Electric Configuration of Surface Mounting Device)

Next, an electric configuration of the surface mounting device 1 will be described with reference to FIG. 5. The surface mounting device 1 is controlled by a control portion 80. The control portion 80 includes a computing processing portion 81 including a CPU. The computing processing portion 81 is connected to a motor control portion 82, a storing portion 83, an image processing portion 84, an external input/output portion 85, a feeder transmitting portion 86, a display portion 88, and an input portion 89.

The motor control portion 82 is configured to drive the X-axis servo motor 35X and the Y-axis servo motor 35Y of the head unit 32 according to a mount program 83A, which will be described later. The motor control portion 82 is further configured to drive the Z-axis servo motor 35Z and the R-axis servo motor 35R of each mount head 32. The motor control portion is further configured to drive the transfer conveyer 20 according to the mount program 83A.

The storing portion 83 includes a read only memory (ROM) and a random access memory (RAM) and stores the mount program 83A and various data 83B. The mount program 83A stored in the storing portion 83 stores board information as to the number of production of the printed boards P1 where objects to be mounted, and component information as to the number and a kind of the electronic components E1 that are to be mounted on the printed boards P1. Various data 83B stored in the storing portion 83 includes data as to the number and a kind of the electronic components E1 provided in each of the feeders 50 included in the feeder-type supplying device 40.

Image signals output from the board check camera C1 and the component check cameras C2 are input to the image processing portion 84. The image processing portion 84 is configured to analyze the images of the components and the boards based on the image signals from the cameras C1, C2.

The external input/output portion 85 is a so-called interface and configured to receive detection signals output from various sensors 85A arranged in the body of the surface mounting device 1. The external input/output portion 85 is configured to control performance of various actuators 85B arranged in the body of the surface mounting device 1 based on control signals output from the computing processing portion 81.

The feeder transmitting portion 86 is connected to the feeder control portion 59 of each of the feeders 50 included in the feeder-type supplying device 40 and controls the feeders 50. The feeder control portion 59 is configured to control driving of the front-side motor 52A and the rear-side motor 54A arranged in the feeder 50.

The display portion 88 includes a liquid crystal display device having a display screen and displays conditions of the surface mounting device 1. The input portion 89 includes a keyboard and is configured to receive input with a manual operation from outside. The feeder control portion 59 is configured to drive the front-side motor 52A and the rear-side motor 54A according to the mount program 73A and also configured to drive the front-side motor 52A and the rear-side motor 54A in response to input of a driving instruction to the input portion 89 by an operator.

The surface mounting device 1 having the above configuration is alternately in a convey state in which the printed board P1 is conveyed by the transfer conveyer 20 and in a mounting state in which the electronic component E1 is mounted on the printed board P1 that is conveyed in the working position of the base mount during an automatic operation. Namely, a conveying operation and a mounting operation are alternately performed during the automatic operation of the surface mounting device 1. Correction (removal) of curl of the component supply tape 60, which will be described next, is performed with the mounting operation.

(Method of Supplying Electronic Components)

The surface mounting device 1 and the feeder-type supplying device 40 according to this embodiment have the above configuration. Next, with reference to FIGS. 6 to 9, a method of correcting (reducing or removing) curl of the component supply tape 60 while supplying the electronic components E1 in the mounting operation will be described. The curl of the component supply tape 60 is corrected when the component supply tape 60 from which the electronic component E1 is picked up at the component pick-up position S1 passes through the clearance G1.

Figure 6:
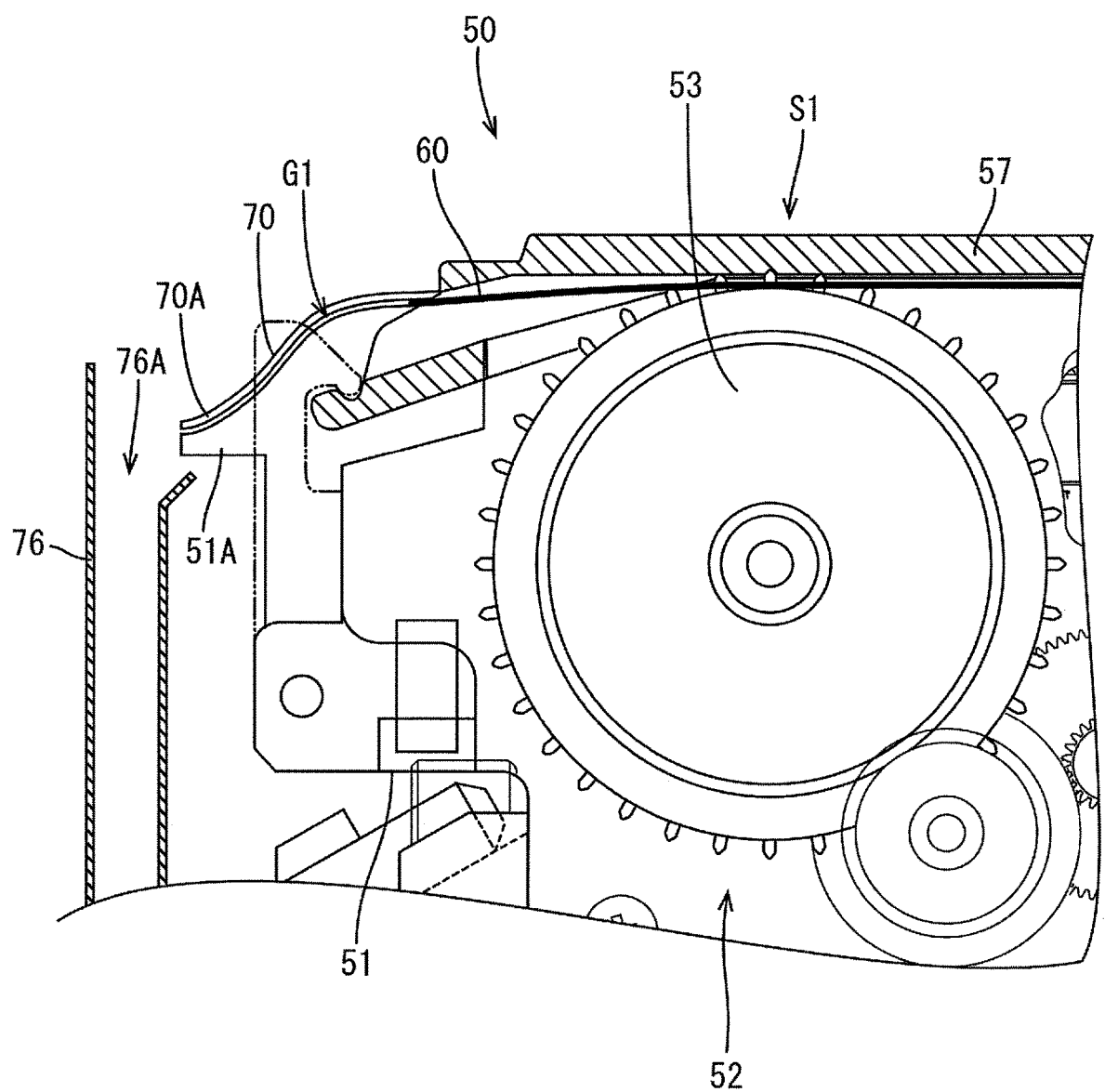
FIG. 6 is a side view illustrating a side view illustrating a method (1) of supplying electronic components.

In the mounting operation of the electronic component E1, the component supply tape 60 from which the electronic component E1 is picked up at the component pick-up position S1 is transferred further frontward in the feeder 50 by the front-side driving portion 52. Accordingly, as illustrated in FIG. 6, the component supply tape 60 is inserted into the clearance G1 through an inlet formed in the front end portion 51A of the body portion 51.

Figure 7:
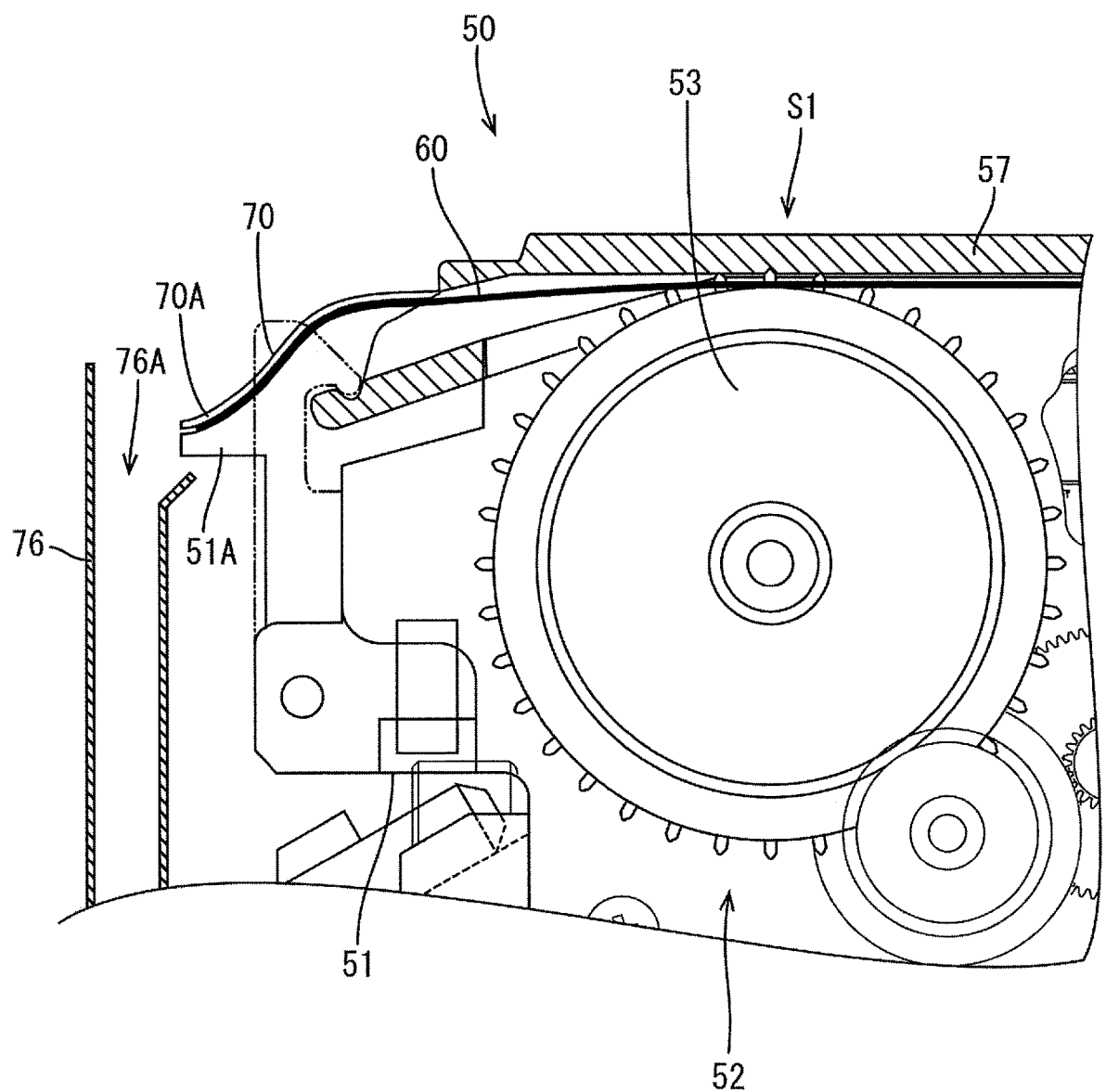
FIG. 7 is a side view illustrating a side view illustrating a method (2) of supplying electronic components.

As illustrated in FIG. 7, the component supply tape 60 inserted in the clearance G1 passes through a rear portion of the clearance G1 and reaches a front portion of the clearance G1. The component supply tape 60 reaching the front portion of the clearance G1 is urged to be curved to project (be recessed) right downward by the curved surface 70A of the front portion of the correcting member 70 that is curved to project (be recessed) right downward while passing through the clearance G1. As a result, apart of the component supply tape 60 is deformed and the curl of the component supply tape 60 is corrected (an example of a correction process), although the component supply tape 60 is curled to project (be recessed) left upward in FIG. 3 when inserted into the clearance G1.

Figure 8:
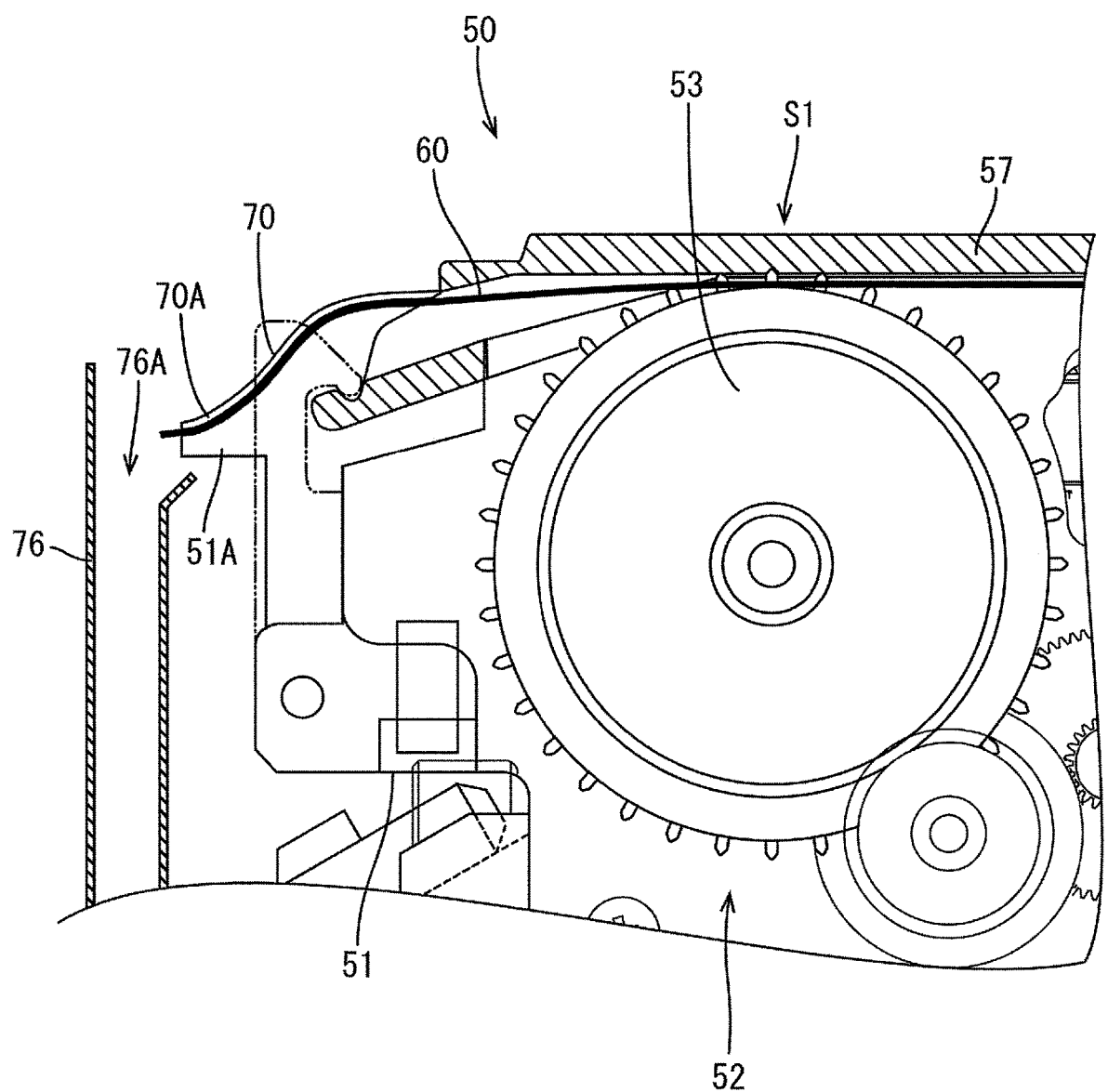
FIG. 8 is a side view illustrating a side view illustrating a method (3) of supplying electronic components.
Figure 9:
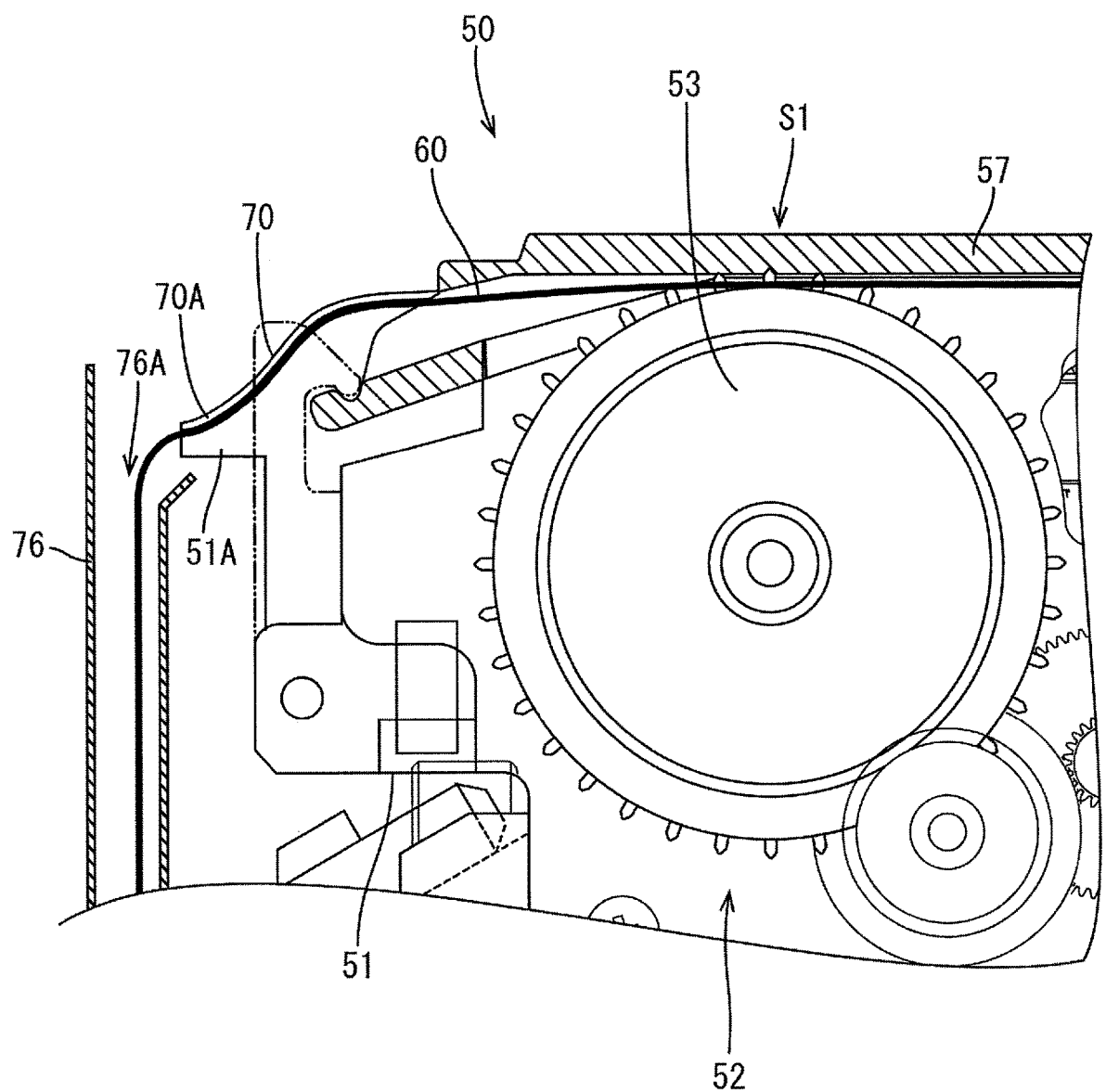
FIG. 9 is a side view illustrating a side view illustrating a method (4) of supplying electronic components.

As illustrated in FIG. 8, the component supply tape 60 whose curl is corrected (removed) at the front portion of the clearance G1 is discharged straight through an outlet of the clearance G1 and is moved further frontward. Then, as illustrated in FIG. 9, the component supply tape 60 enters the tape chute 76 through the upper opening 76A of the tape chute 76 and extends downward straight vertically due to the weight thereof. The component supply tape 60 entering the tape chute 76 is discharged through the lower opening of the tape chute 76 to the collection box.

(Effects of First Embodiment)

As described before, according to this embodiment, the feeder-type supplying device 40 includes the correction member 70 on the transfer path of the component supply tape 60. Specifically, the feeder 50 includes the correction member 70 in the front end portion 51 of the body portion 51, and the correction member 70 is formed of a curved plate spring. The correction member 70 has the curved surface 70A that is curved and projects (recessed) in an opposite side from the curl of the component supply tape 60. Therefore, a part of the component supply tape 60 is urged to be deformed while the component supply tape 60 passes through the clearance G1 between the front portion 51A and the correction member 70, and the curl of the component supply tape 60 is corrected before the component supply tape 60 reaches the tape chute 76.

The uncurled component supply tape 60 reaches the tape chute 76 and therefore, the component supply tape 60 is less likely to be jammed in the tape chute 76 due to the curl of the component supply tape 60. According to the feeder-type supplying device 40 of this embodiment, the correction member 70 requiring no driving mechanism is arranged on the transfer path of the component supply tape 60. With such a simple structure, the tape jamming in the tape chute 76 is less likely to be caused.

In this embodiment, after a part of the top tape 64 is cut and the top tape 64 is folded back in one side with respect to the width dimension of the carrier tape 62, the top tape 64 is transferred to a component delivery position S1 together with the carrier tape 62. In the body portion 51 of the feeder 50, the correction member 70 is arranged on a front side with respect to the component supply position S1.

According to such a configuration, the component supply tape 60 passing through the correction member 70 includes the carrier tape 62 and the top tape 64 adhering to the carrier tape 62. Therefore, the curl of the carrier tape 62 and the curl of the top tape 64 are corrected (removed) by the correction member 70. Compared to a configuration in that the carrier tape 62 from which the top tape 64 is completely separated is transferred to the component pick-up position S1 and only the curl of the carrier tape 62 is corrected by the correction member 70, the component supply tape 60 that is to be corrected by the correction member 70 has great rigidity and the curl of the component supply tape 60 is easily corrected by the correction member 70 in this embodiment.

In this embodiment, when the component supply tape 60 is discharged from the front end portion 51A of the body portion 51 of the feeder 50 toward the tape chute 76, the curl of the component supply tape 60 is corrected by the correction member 70 such that the component supply tape 60 extends vertically straight downward due to the weight thereof. As illustrated in FIG. 9, the tape chute 76 is arranged to extend vertically straight and has a path of a reduced width. As a result, the space for the tape chute 76 is reduced and the surface mounting device 1 can be reduced in size.

Second Embodiment

A second embodiment will be described with reference to FIGS. 10 to 12. A feeder-type supplying device according to the second embodiment includes a correction member 170 on a transfer path of the component supply tape 60 and the correction member 170 has a configuration different from that of the first embodiment. Other configurations of the feeder-type supply device and the configuration of the surface mounting device are the same as those of the first embodiment and will not be described. A feeder 150 of this embodiment includes the correction member 170 in a front end portion 151A of a body portion 151 similarly to that of the first embodiment.

Figure 10:
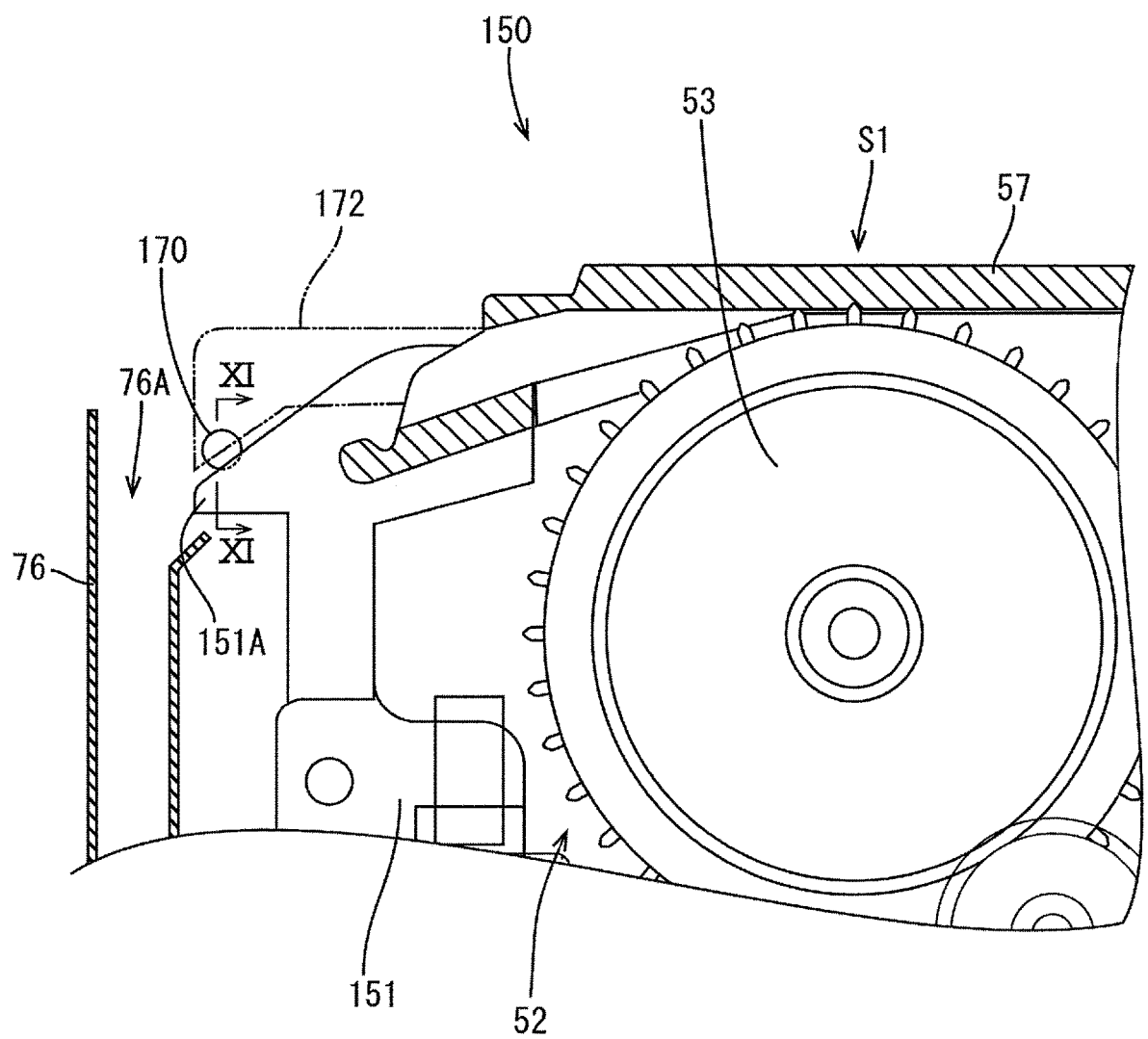
FIG. 10 is a side view illustrating a portion of a feeder near a front-side driving portion according to a second embodiment.
Figure 11:
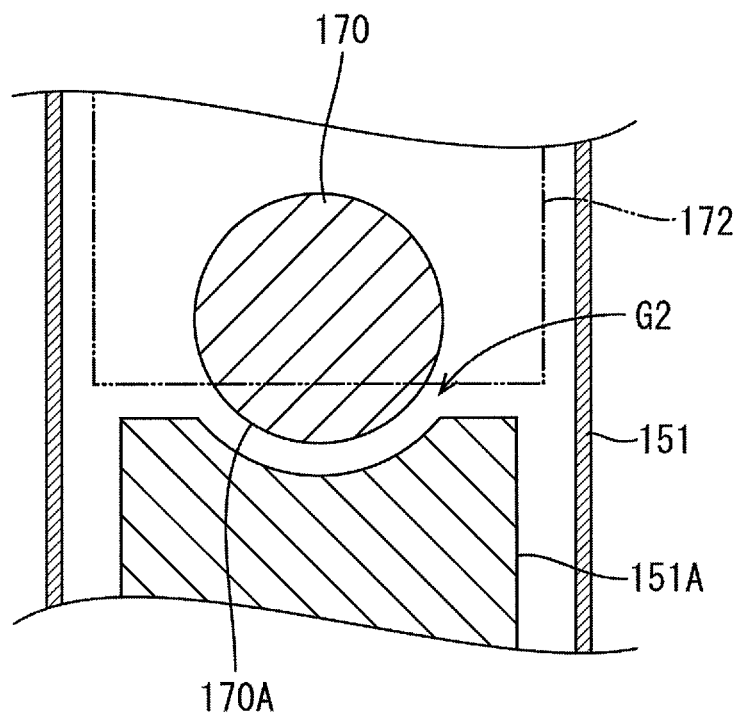
FIG. 11 is a cross-sectional view of a correction member taken along XI-XI line in FIG. 10.

As illustrated in FIG. 10, the feeder 150 includes a support member 172 at the front end portion 151A of the body portion 151 such that a space is provided between the front portion 151A and the support member 172. The correction member 170 comprises a ball made of metal and is rotatably supported by the support member 172. The front portion 151A of the body portion 151 and the correction member 170 are arranged such that outermost end portions thereof are aligned with each other. The front end portion 151A of the body portion 151 has an upper surface portion opposite the correction member 170. As illustrated in FIG. 11, the upper surface portion of the front end portion 151A is recessed downward along a peripheral surface (an example of a tape urging portion) 170A of the correction member 170. A small clearance G2 is provided between a recessed surface and the peripheral surface 170A such that the component supply tape 60 having a top tape that is cut can pass through the clearance G2.

According to such a configuration of the front end portion 151A of the body portion 151, after the electronic component E1 is picked up from the component supply tape 60 at the component pick-up position S1 during the operation of mounting the electronic component E1, the component supply tape 60 is transferred further forward from the feeder 150 by the front-side driving portion 52 and is inserted in the clearance G2 between the front end portion 151A of the body portion 151 and the correction member 170.

Figure 12:
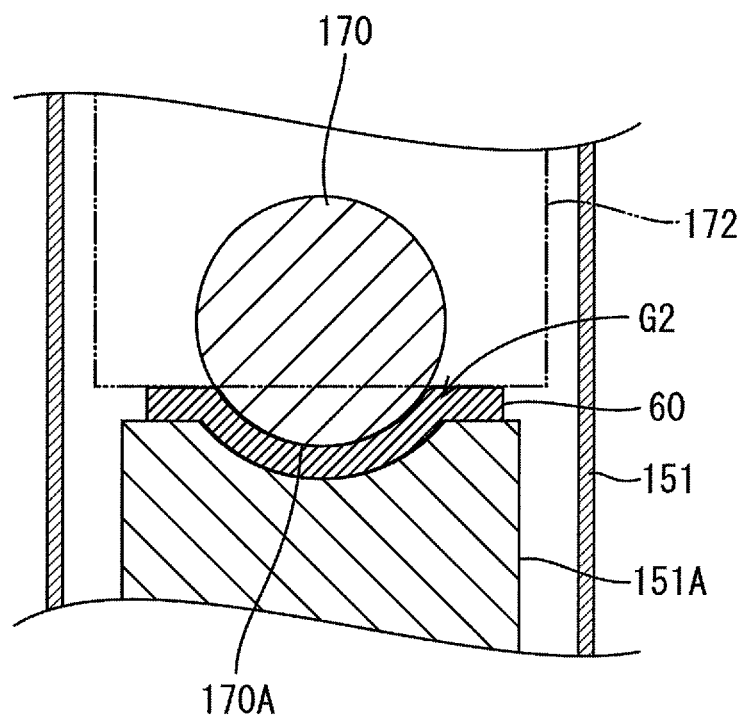
FIG. 12 is a cross-sectional view illustrating a component supply tape whose curl is corrected and corresponding with FIG. 11.

As illustrated in FIG. 12, the component supply tape 60 inserted in the clearance G2 is urged downward at a middle portion with respect to a width thereof by the peripheral surface 170A of the correction member 170 while passing through the clearance G2. As a result, a part of the component supply tape 60 is deformed and the curl of the component supply tape 60 is corrected (an example of the correction process). After the curl is corrected by the correction member 170, the component supply tape 60 without having the curl is inserted in the tape chute 76 and discharged to the collection box.

According to this embodiment, as described before, the component supply tape 60 is urged to be curved with respect to the width dimension by the peripheral surface 170A of the correction member 170 and the curl of the component supply tape 60 is corrected by the correction member 170. As a result, the component supply tape 60 is less likely to be jammed in the tape chute 76 and less occurrence of the tape jamming in the tape chute 76 is achieved with a simple structure.

Third Embodiment

A third embodiment will be described with reference to FIGS. 13 and 14. A feeder-type supplying device of the third embodiment differs from that of the first embodiment and that of the second embodiment in a configuration and a mounting method of a correction member 270 arranged on a transfer path of the component supply tape 60. Other configurations of the feeder-type supplying device and the configuration of the surface mounting device are the same as those of the first embodiment and will not be described.

The correction member 270 of this embodiment is detachably mounted in a body portion of a feeder 250. Specifically, as illustrated in FIG. 13, the correction member 270 includes a support shaft 270A provided in a rear portion thereof and a flat surface portion 270B provided on an upper surface of a front portion thereof. The support shaft 270A is mounted in the body portion 251 such that an axial direction thereof matches a left-right direction. Accordingly, the correction member 270 is mounted in the body portion 251 such that the flat surface portion 270B is arranged below the front end portion 251A of the body portion 251.

Figure 13:
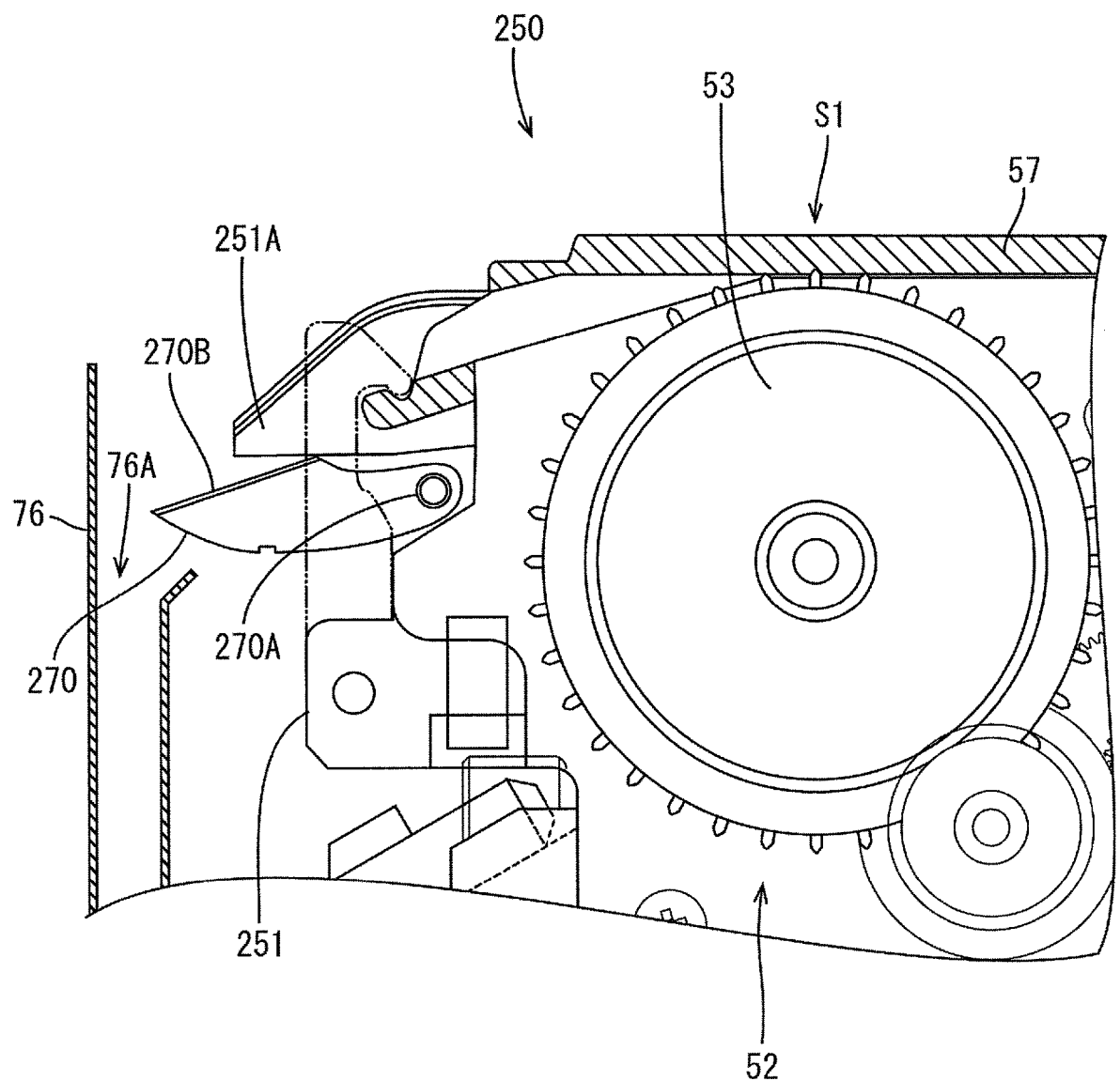
FIG. 13 is a side view illustrating a portion of a feeder near a front-side driving portion according to a third embodiment.

As illustrated in FIG. 13, the correction member 270 is mounted in the body portion 251 such that the flat surface portion 270B is sloped downward from the rear side to the front side. The correction member 270 is thus mounted in the body portion as described before and therefore, after the electronic component E1 is picked up from the component supply tape 60 at the component pick-up position S1, the component supply tape 60 is transferred from the front end portion 251A of the body portion 251 to outside of the body portion 251 by the front-side driving portion 52.

Figure 14:
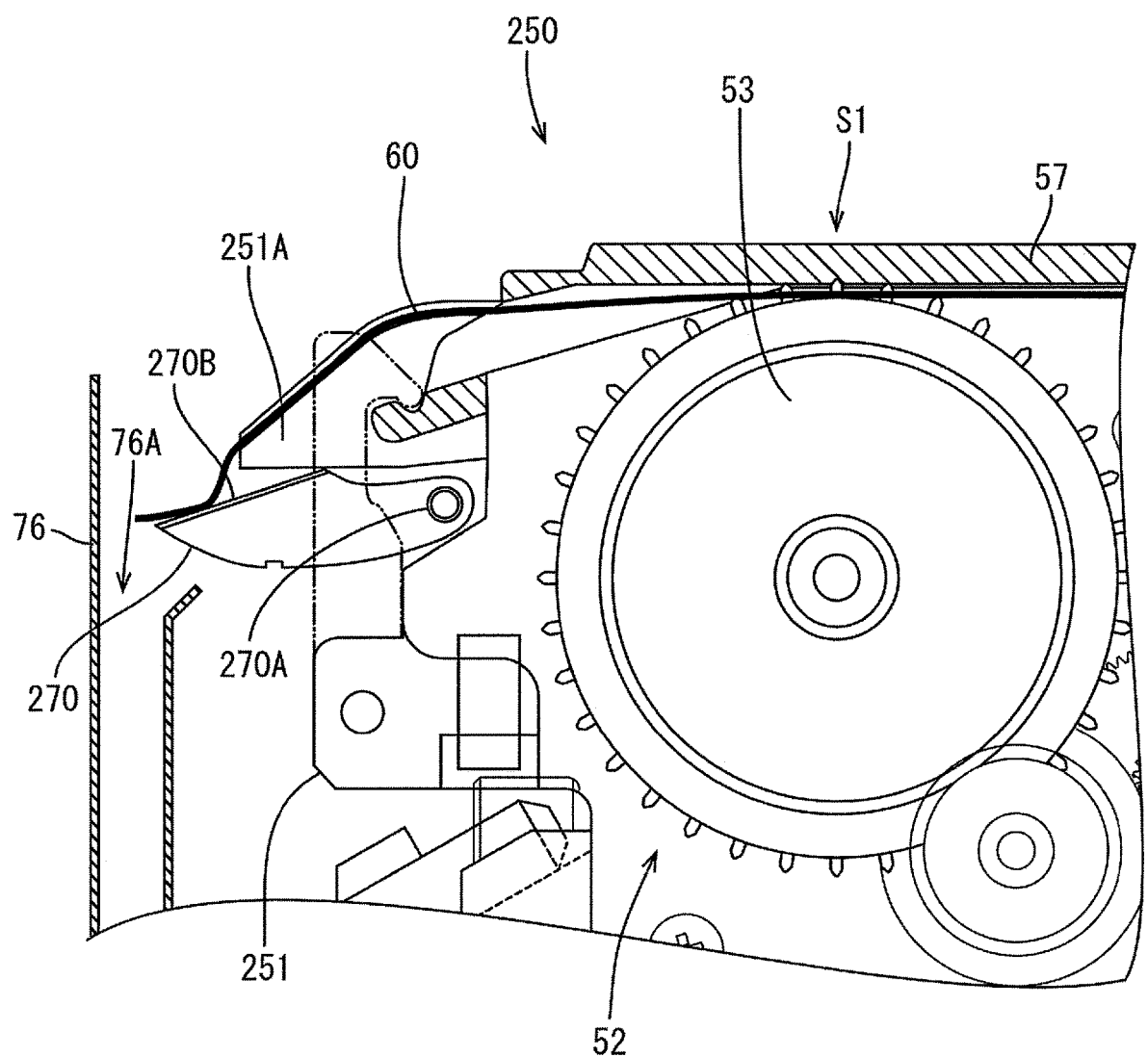
FIG. 14 is a side view illustrating a component supply tape whose curl is corrected.

As illustrated in FIG. 14, the component supply tape discharged outside the body portion 251 comes in contact with the flat surface portion 270B of the correction member 270 that is arranged below the front end portion 251A of the body portion 251 and the component supply tape is bent frontward. The component supply tape 60 thus comes in contact with the flat surface portion 270B of the correction member 270 and is bent. Accordingly, a part of the component supply tape 60 is deformed and the curl of the component supply tape 60 is corrected (an example of the correction process).

The flat surface portion 270B of the correction member 270 is sloped as described before. Therefore, after the curl of the component supply tape 60 is corrected (removed) by the correction member 270, the component supply tape 60 is guided by the flat surface portion 270B toward the upper opening 76A of the tape chute 76 and enters the tape chute 76 and is discharged to the collection box. According to this embodiment, the curl of the component supply tape 60 is corrected by the flat surface portion 270B of the correction member 270. Therefore, less occurrence of the tape jamming in the tape chute 76 is achieved with such a simple structure.

In this embodiment, the correction member 270 is detachably mounted on the body portion 251 of the feeder 250. Therefore, the correction member 270 can be easily mounted on the feeder 250 without having the correction member 270. The correction member 270 can be easily detached from the feeder 250 if it is not necessary. This improves convenience of the correction member 270.

Other Embodiments

The present disclosure is not limited to the aspects explained in the above description made with reference to the drawings. The following aspects may be included in the technical scope of the present disclosure, for example.

(1) In each of the above embodiments, the curl of the component supply tape is corrected with configurations as follows. The correction member comprises a curved plate spring having a curved surface projecting in an opposite direction from the curl of the component supply tape. A part of the component supply tape is urged with the curved surface to correct the curl of the tape. The component supply tape is curved with respect to the width dimension thereof by the correction member comprising a ball to correct the curl of the tape. The component supply tape is contacted with the flat surface portion of the correction member and curved to correct the curl of the tape. However, the structure of the correction member to correct the curl of the component supply tape and the method of correcting the curl are not limited thereto. For example, the correction member may be configured to urge the component supply tape so as to be twisted with respect to the front-rear direction. Thus, the curl of the component supply tape may be corrected.

(2) In each of the above embodiments, the correction member is arranged in the front portion of the body portion of the feeder. The correction member is arranged between the reel support member and the tape chute and for example, the correction member may be arranged on a rear side with respect to the body portion. In such a configuration, the curl of the component supply tape having the electronic components thereon is corrected by the correction member.

(3) Other than each of the above embodiments, the configurations of the feeder-type supplying device and the surface mounting device may be altered as appropriate.

The embodiments according to the present technology are described in detail. However, the above description is only examples and does not limit a scope of the claims. The technology described in the claims includes modifications and variations of the above described specific examples.

The invention claimed is:

1. A feeder supplying components that are included in a component supply tape wound around a reel, the feeder comprising:
a body section having an elongated shape and including a tape inlet at a first end thereof and a tape outlet at a second end thereof with respect to a longitudinal direction thereof, the tape inlet and the tape outlet being continuous to outside of the feeder;
a first tape transfer mechanism disposed in the body section and near the first end of the body section;
a second tape transfer mechanism disposed in the body section and near the second end of the body section; and
a tape cavity extending through the body section from the tape inlet to the tape outlet, the tape cavity including a curved tape cavity in an end portion thereof and the curved tape cavity including the tape outlet, wherein
the first tape transfer mechanism transfers the component supply tape including a carrier tape having the components thereon and a top tape through the tape cavity to the second tape transfer mechanism,
the second tape transfer mechanism transfers a used component supply tape through the curved tape cavity to the tape outlet, the used component supply tape includes the carrier tape from which the components are picked up at a component pick-up position and the top tape, the component pick-up position is defined on a portion of the tape cavity above the second tape transfer mechanism,
the curved tape cavity is defined by a lower-side tape receiving member and an upper-side tape press member that are opposite each other while having a space therebetween,
the lower-side tape receiving member has a lower curved surface that faces upward and is recessed downward,
the upper-side tape press member has a curved surface that is opposite the lower curved surface and projects downward so as to extend along the lower curved surface, and
the space is defined by the lower curved surface and the curved surface and the lower-side tape receiving member and the upper-side tape press member of the curved tape cavity restrict the used component supply tape to travel within the space and along the lower curved surface and the curved surface.

2. The feeder according to claim 1, wherein the curved tape cavity is located between the second tape transfer mechanism and the tape outlet.

3. The feeder according to claim 1, wherein
the lower-side receiving member has a sloped surface that is inclined downward toward the tape outlet and includes the lower curved surface near the tape outlet, and
the upper-side tape press member has a sloped surface that extends along the sloped surface of the lower-side tape receiving member and includes the curved surface opposite the lower curved surface.

4. The feeder according to claim 1, wherein the lower-side tape receiving member and the upper-side tape press member have a S-shape.

5. The feeder according to claim 1, the lower-side tape receiving member and the upper-side tape press member are arranged such that outermost end portions thereof that form the tape discharge outlet are aligned with each other.

6. The feeder according to claim 1, wherein the upper-side tape press member is a metal plate spring.

7. The feeder according to claim 1, wherein the upper-side tape press member is a metal ball that is rotatably fixed to the end portion of the body section.

8. A component supplying device comprising:
the feeder according to claim 1; and
a reel support section rotatably supporting the reel.

9. A surface mounting device comprising:
the component supplying device according to claim 8;
a base mount where a board is disposed;
a component mounting device configured to mount the component that is picked up at the component pick-up position onto the board that is disposed on a component mount position of the base mount; and
a convey device configured to convey the board to the component mount position.

* * * * *